United States Patent
Ikeda et al.

(10) Patent No.: US 10,903,041 B2
(45) Date of Patent: Jan. 26, 2021

(54) PATTERN MEASURING METHOD, PATTERN MEASURING TOOL AND COMPUTER READABLE MEDIUM

(71) Applicant: Hitachi High-Tech Corporation, Tokyo (JP)

(72) Inventors: Uki Ikeda, Tokyo (JP); Shunsuke Mizutani, Tokyo (JP); Makoto Suzuki, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 0 days.

(21) Appl. No.: 16/424,803

(22) Filed: May 29, 2019

(65) Prior Publication Data

US 2019/0378679 A1    Dec. 12, 2019

(30) Foreign Application Priority Data

Jun. 6, 2018 (JP) ................................. 2018-108258

(51) Int. Cl.
*H01J 37/22* (2006.01)
*H01J 37/20* (2006.01)
*H01J 37/28* (2006.01)

(52) U.S. Cl.
CPC ............ *H01J 37/222* (2013.01); *H01J 37/20* (2013.01); *H01J 37/28* (2013.01); *H01J 2237/2817* (2013.01)

(58) Field of Classification Search
CPC .. H01J 37/00; H01J 37/02; H01J 37/20; H01J 37/22; H01J 37/222; H01J 37/26; H01J 37/261; H01J 37/263; H01J 37/27; H01J 37/28

USPC ............................ 250/306, 307, 492.1, 492.3
See application file for complete search history.

(56) References Cited

U.S. PATENT DOCUMENTS

| | | | |
|---|---|---|---|
| 4,733,074 A * | 3/1988 | Kato ........................ | H01J 37/28 250/307 |
| 7,164,128 B2 | 1/2007 | Miyamoto et al. | |
| 8,604,431 B2 | 12/2013 | Murakawa et al. | |
| 2013/0284924 A1 * | 10/2013 | Mizuochi ........... | G01N 23/2206 250/310 |

FOREIGN PATENT DOCUMENTS

| | | |
|---|---|---|
| JP | 2012-177654 A | 9/2012 |
| JP | 2013-69693 A | 4/2013 |

\* cited by examiner

*Primary Examiner* — Jason L McCormack
(74) *Attorney, Agent, or Firm* — Crowell & Moring LLP

(57) ABSTRACT

The present disclosure relates to a pattern measuring method to appropriately measure a height and a depth of a pattern having a high aspect ratio. The method includes measuring a width between a first pattern and another pattern formed on a wafer; calculating a value regarding an azimuth angle of a signal emitted from the wafer; and calculating height information from a portion between the first pattern and the other pattern to an upper portion of a pattern based on the measured width between the first pattern and the other pattern, the value regarding the azimuth angle, the value regarding an elevation angle, and relationship information thereof.

16 Claims, 15 Drawing Sheets

[FIG. 1]
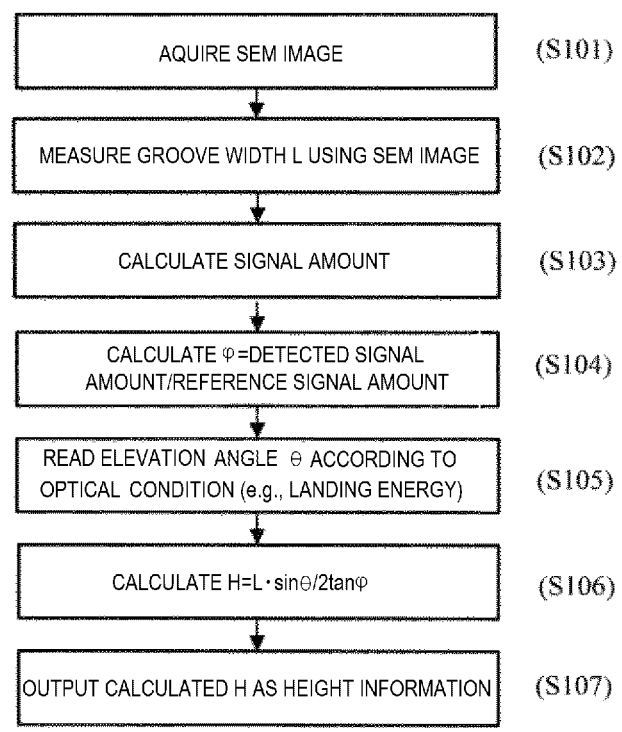

[FIG. 2]
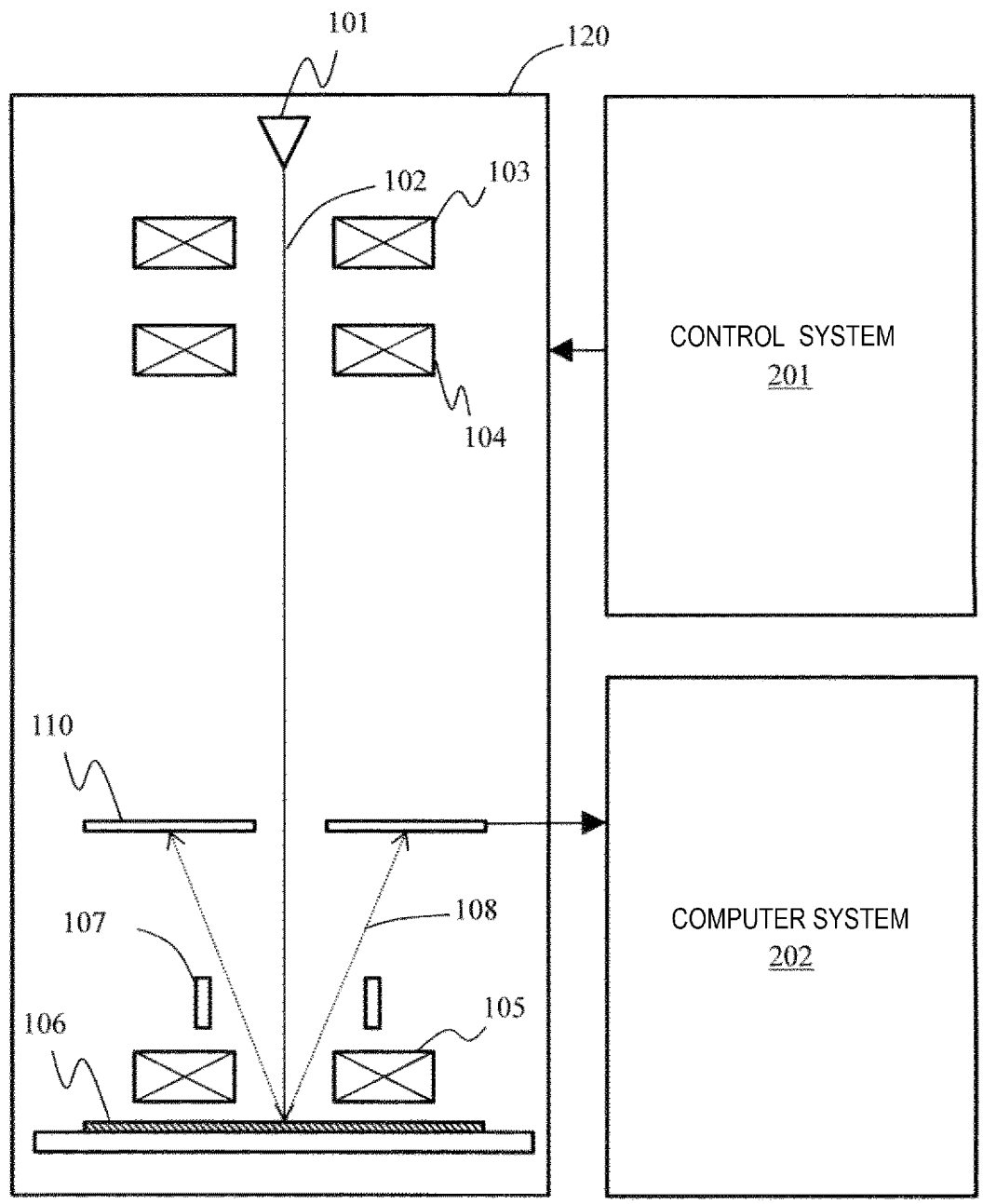

FIG. 5A
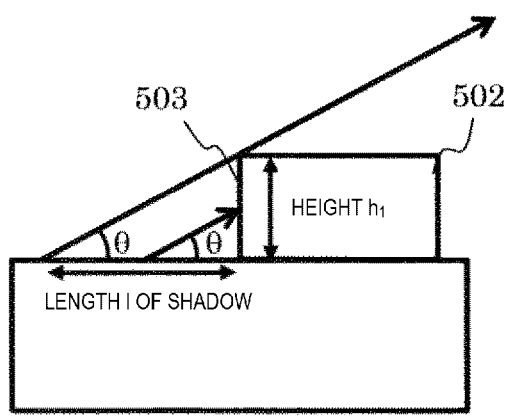
FIG. 5C
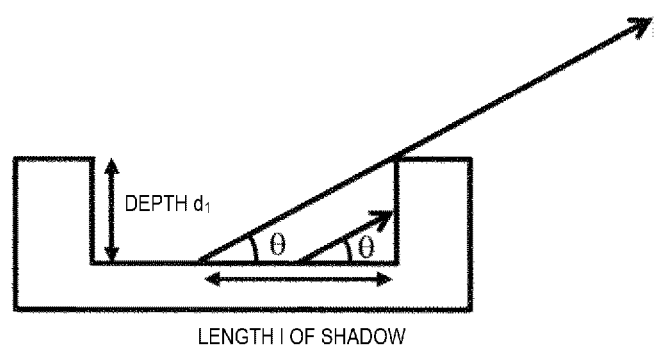
FIG. 5B
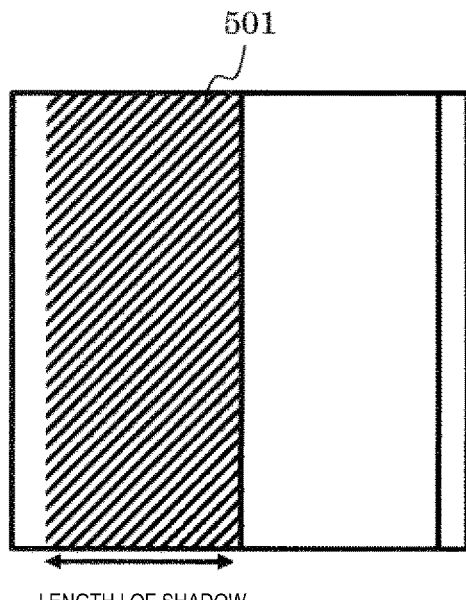
FIG. 5D
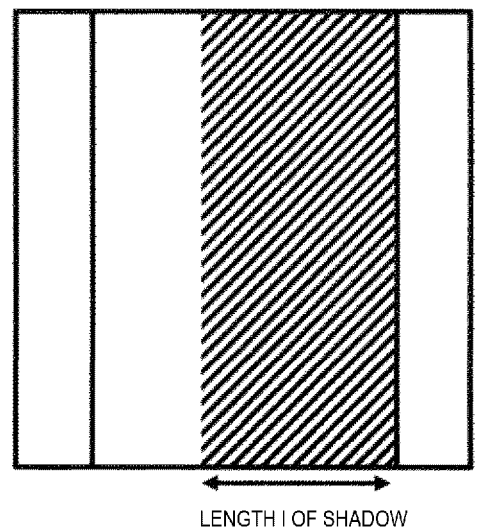
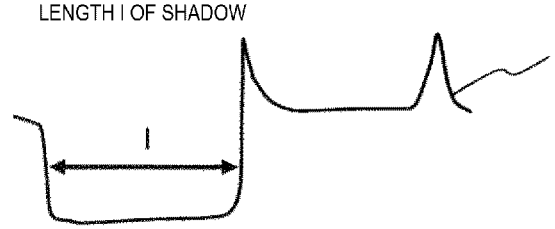

[FIG. 6]
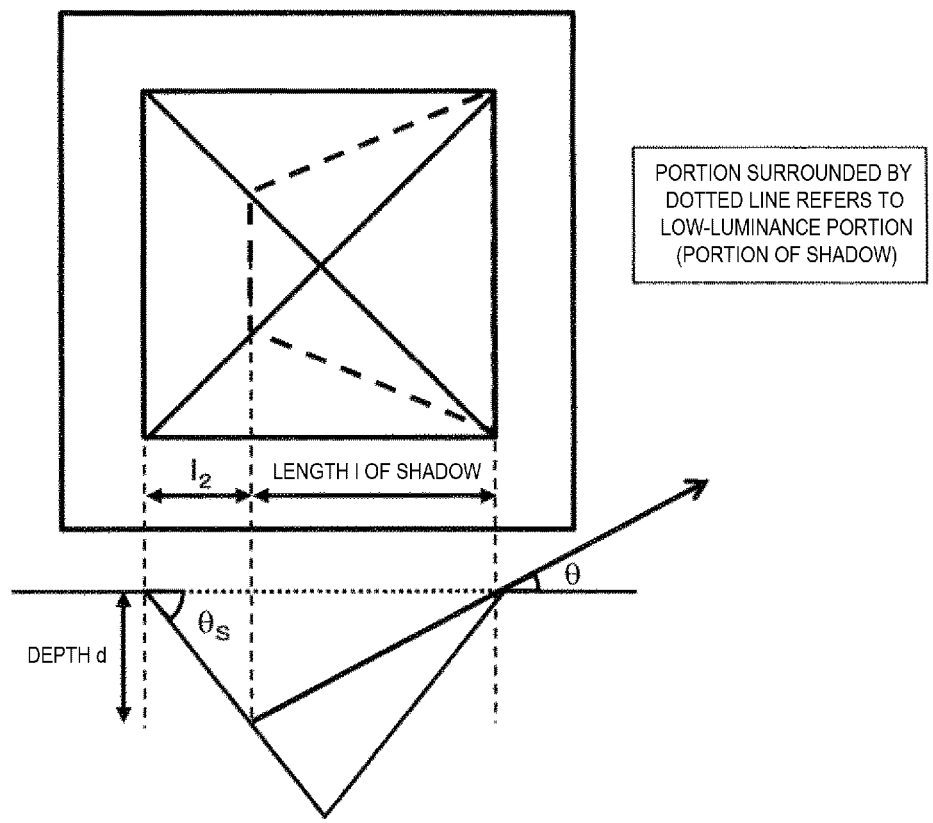

[FIG. 7]
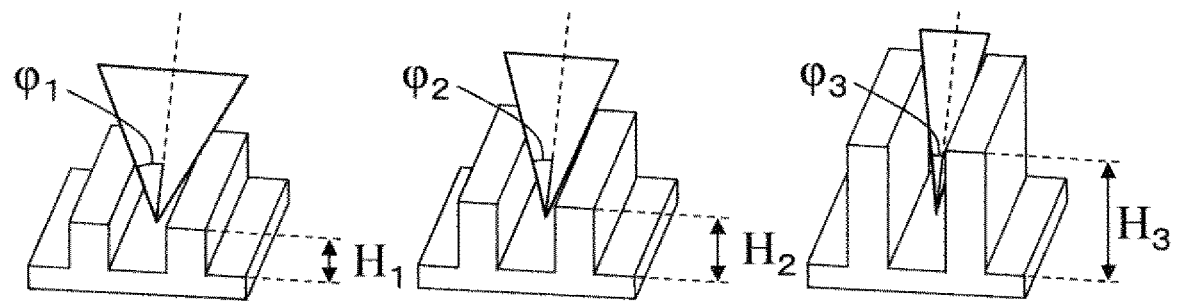
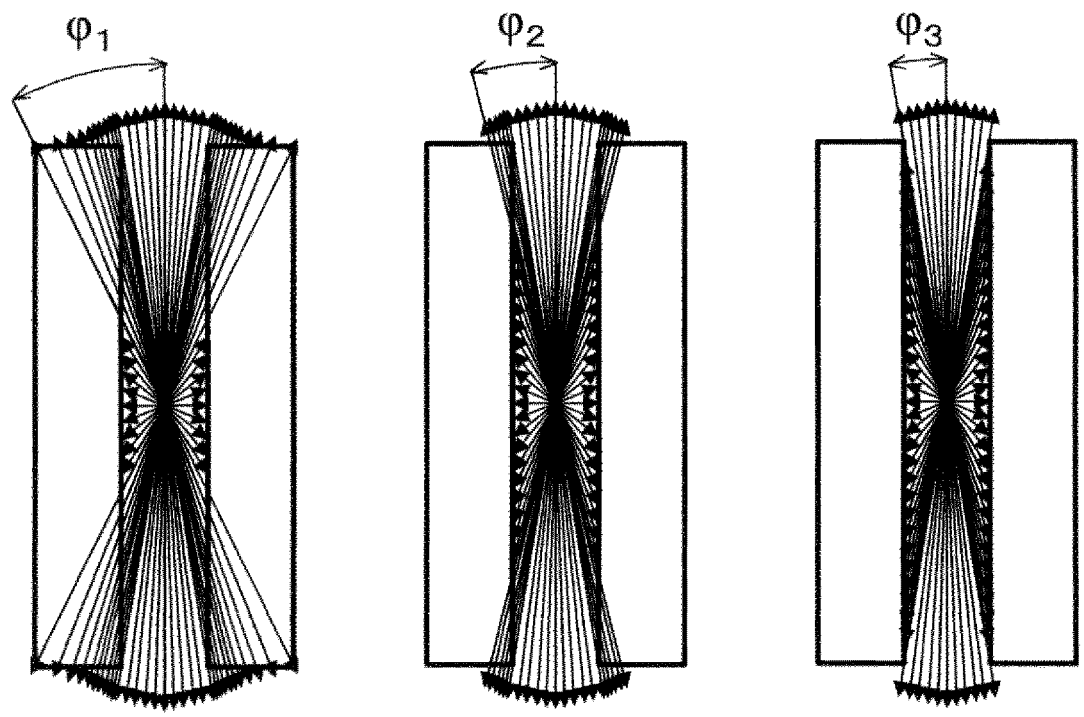

[FIG. 8]
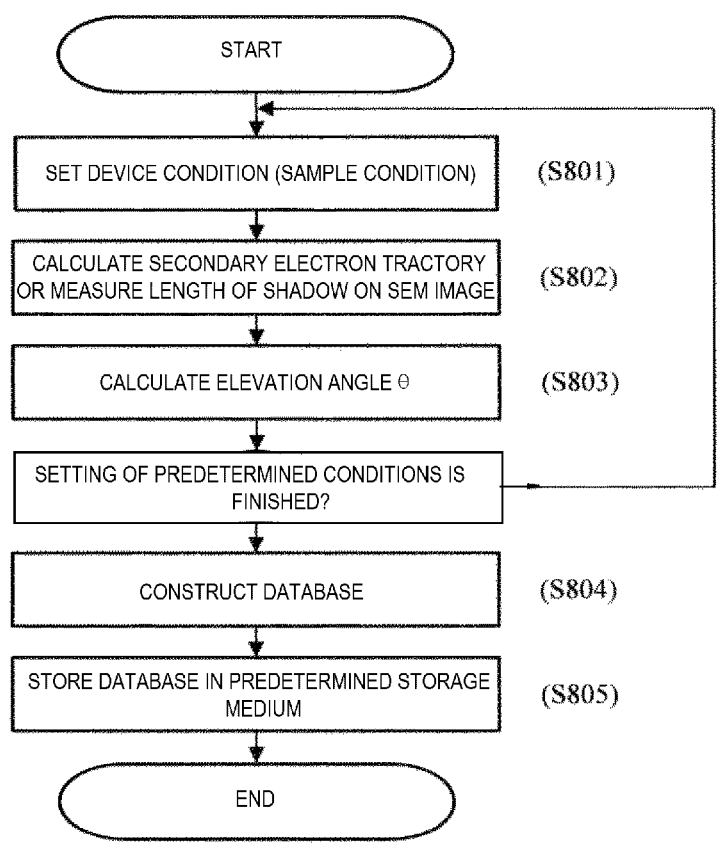

[FIG. 9]
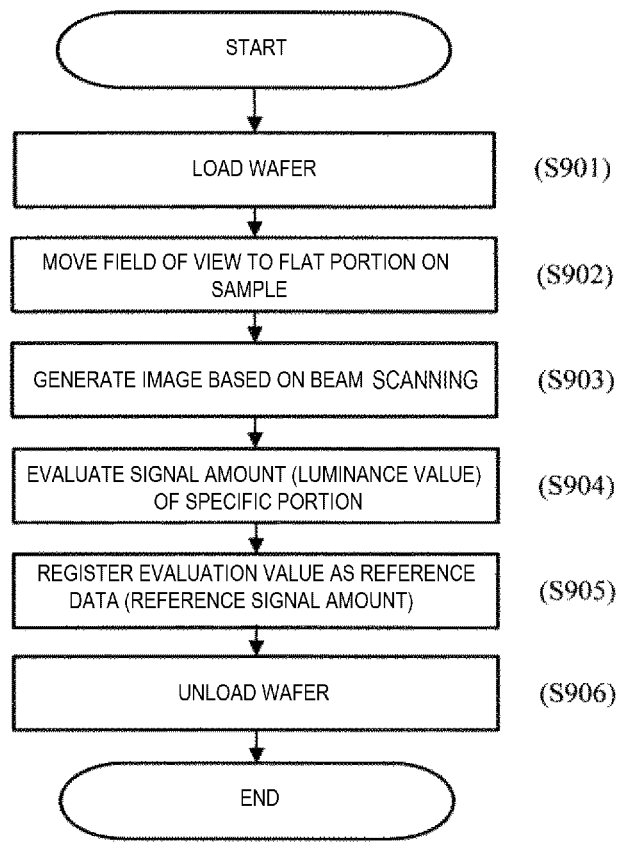

[FIG. 10]
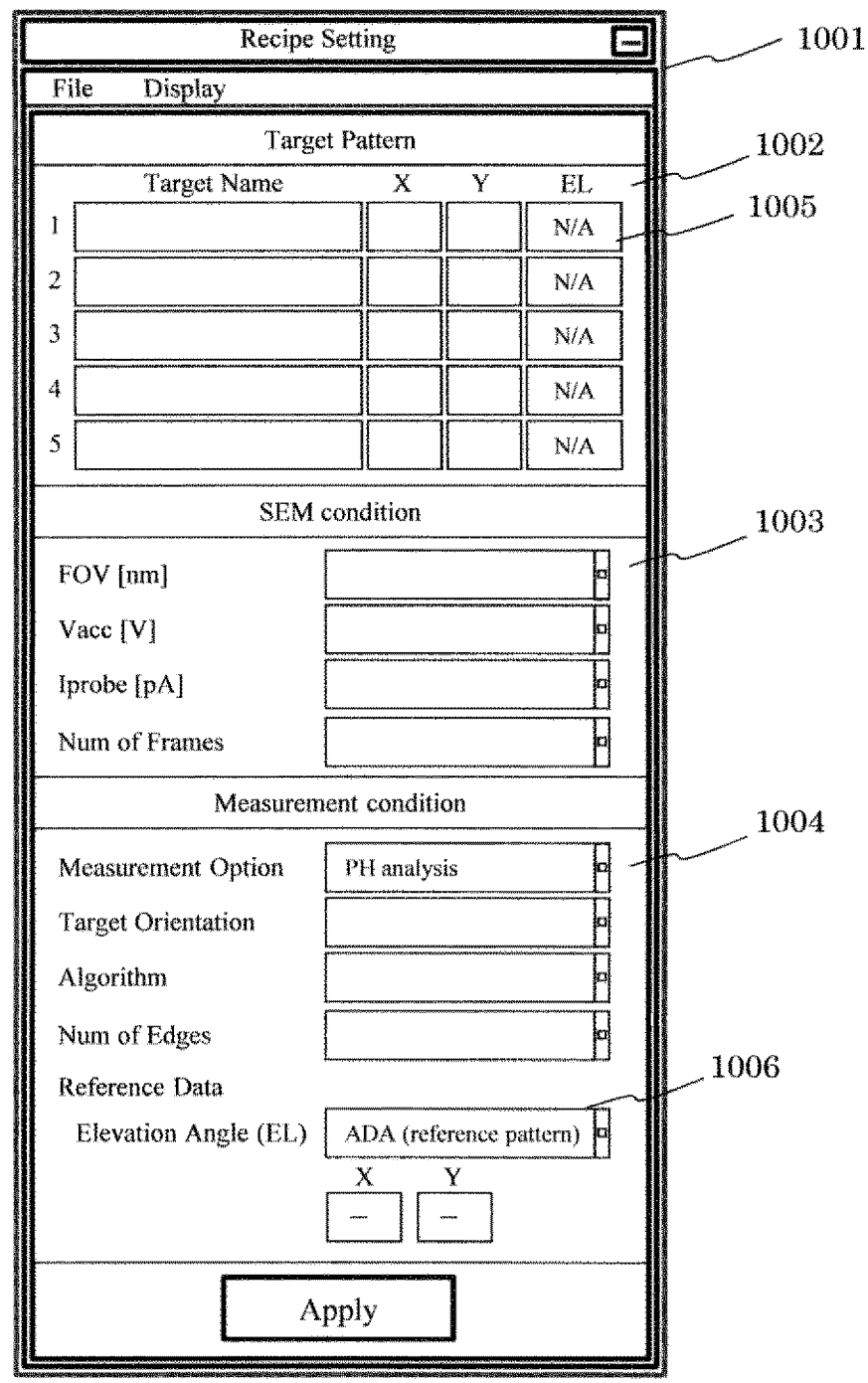

[FIG. 11]
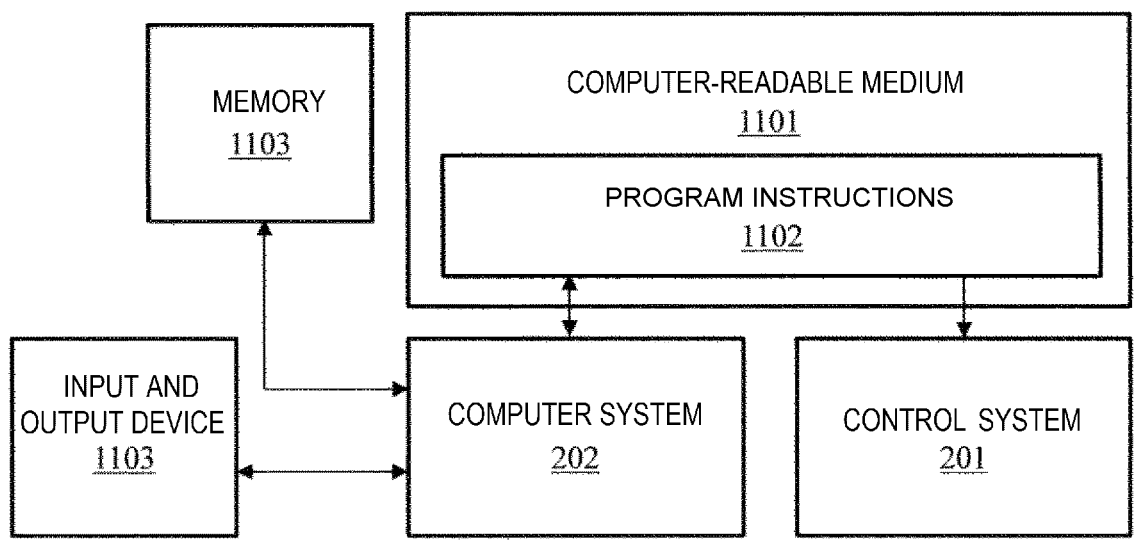
[FIG. 12]
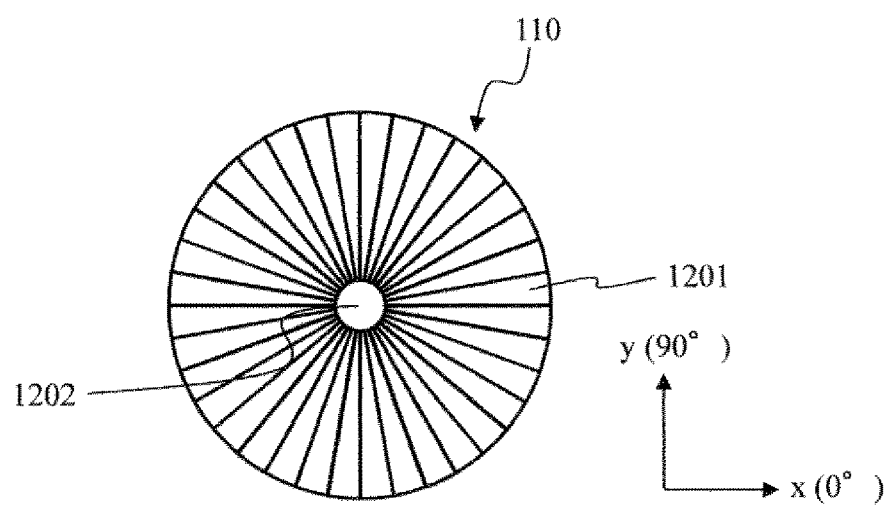

[FIG. 13]
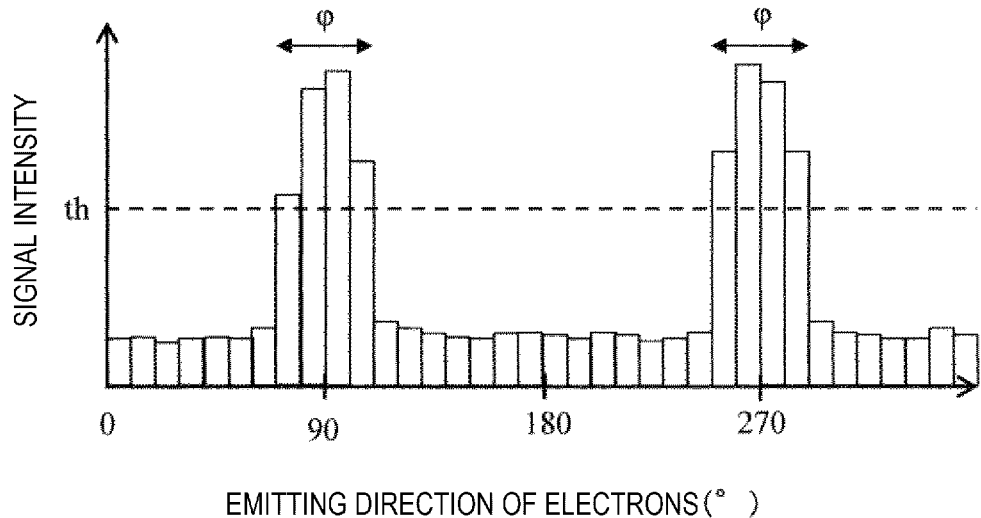
[FIG. 14]
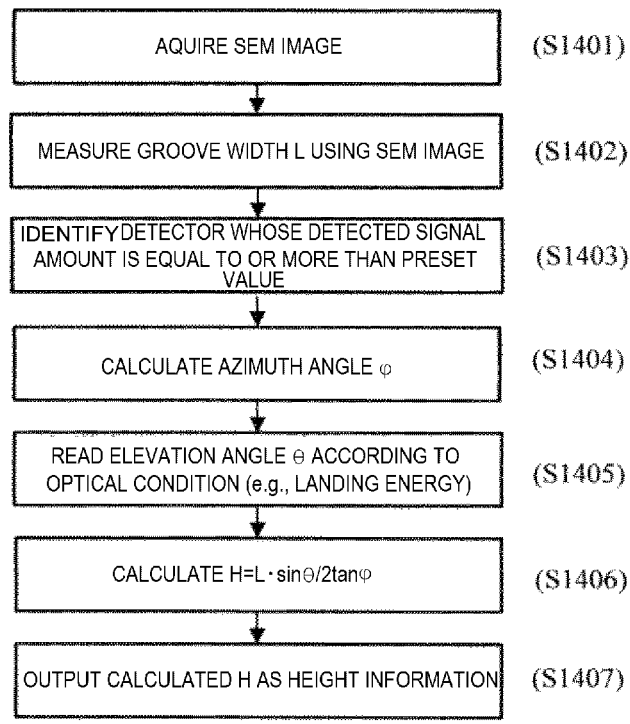

[FIG. 15]
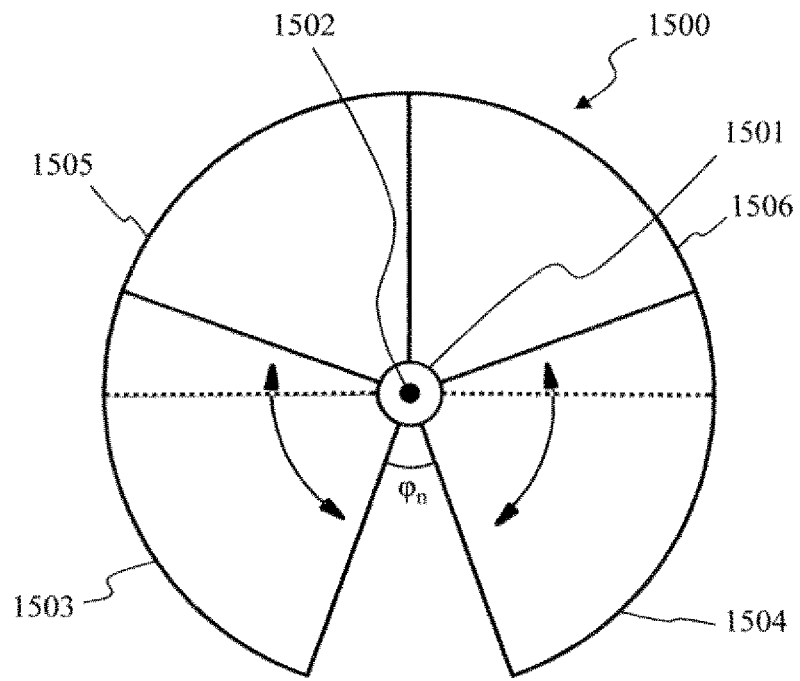
[FIG. 16]
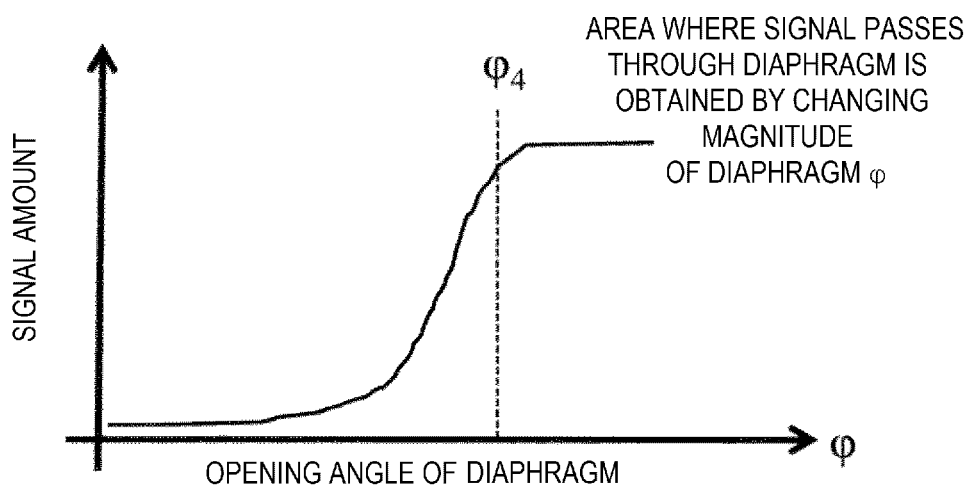

[FIG. 17]
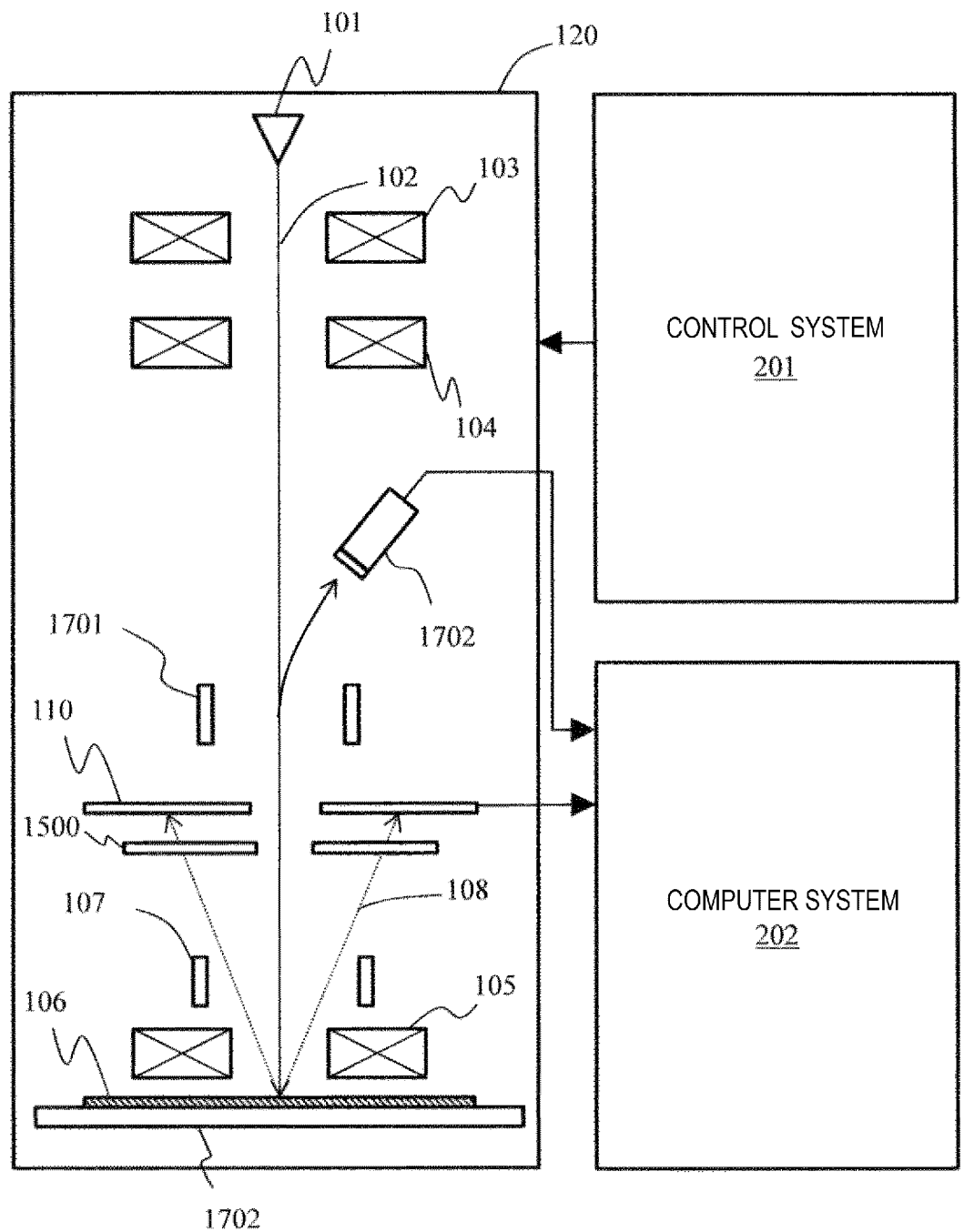

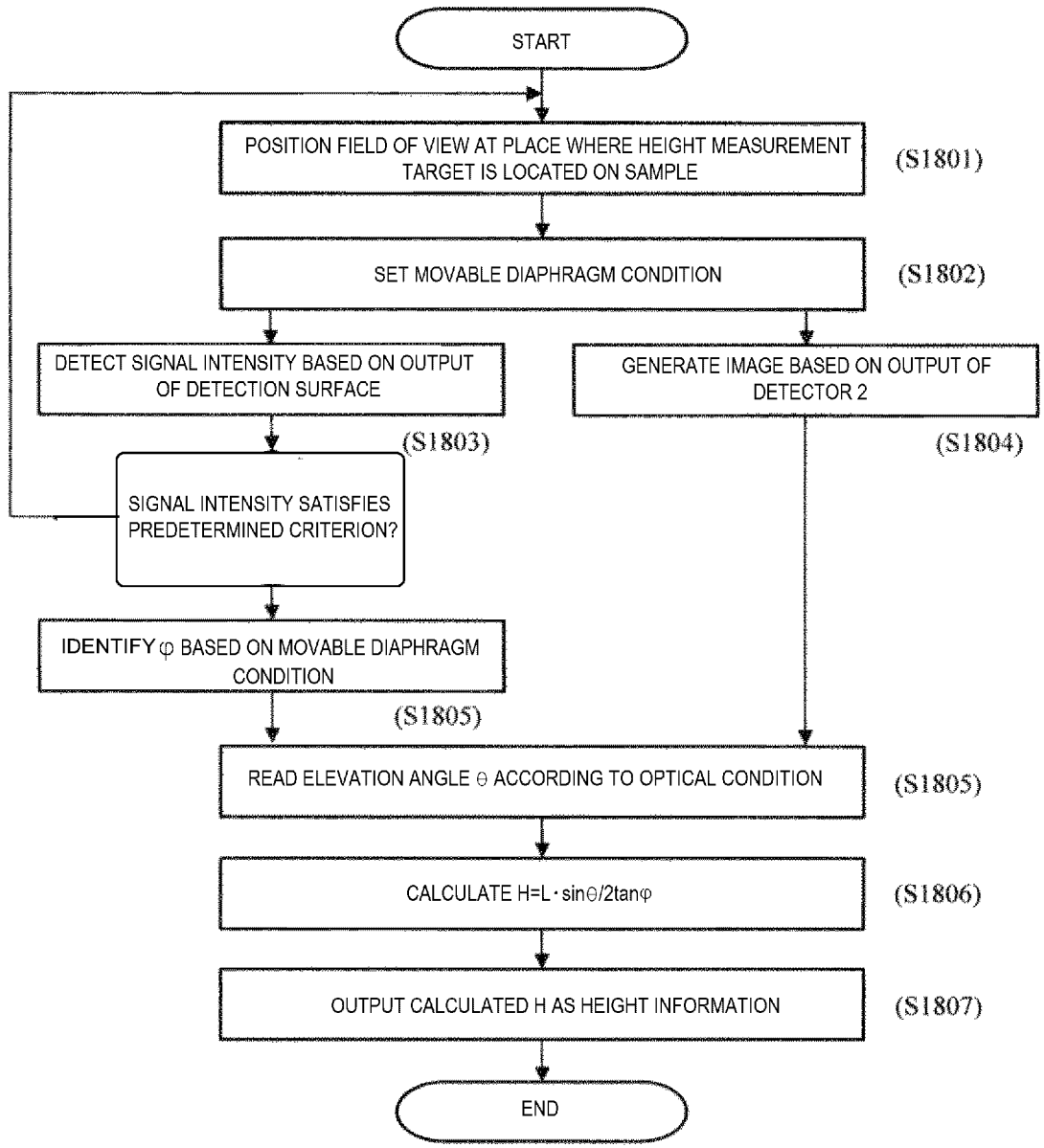
[FIG. 18]

PATTERN MEASURING METHOD, PATTERN MEASURING TOOL AND COMPUTER READABLE MEDIUM

TECHNICAL FIELD

The present invention relates to a method and a device for measuring a height of a pattern, and particularly to a method and a device for measuring a height of a pattern based on width information of a recessed portion and a signal amount.

BACKGROUND ART

PTL 1 discloses a pattern height measuring device that measures a height of a pattern formed on a sample by detecting secondary electrons obtained by irradiating the sample with an electron beam. PTL 1 describes a method of calculating a pattern height H by solving height H=a length L of a shadow appearing in the pattern×an apparent angle θ of a detector to a sample surface.

PTL 2 describes a method for observing a sample, in which an image is generated by irradiating the sample having a known shape with an electron beam from an oblique direction, and an incident direction of the electron beam is estimated based on geometric deformation of the known shape contained in the image, so as to obtain a three-dimensional shape of the sample to be observed using information on the estimated incident direction of the electron beam.

CONVENTIONAL ART LITERATURE

Patent Literature

PTL 1: JP-A-2012-177654 (Corresponding U.S. Pat. No. 8,604,431)
PTL 2: JP-A-2013-069693 (Corresponding U.S. Pat. No. 7,164,128)

SUMMARY OF INVENTION

Technical Problem

An interval between patterns becomes narrower and the patterns tend to have a higher aspect ratio with miniaturization and integration of semiconductor devices in recent years. In a method of using a length of a shadow as in PTL 1, it is difficult to perform measurement when a width of a groove or the like is smaller than the length of the shadow. Further, when an inclined beam is used as in PTL 2, it is difficult to measure a height of a pattern having a high aspect ratio since the beam cannot reach the bottom of the pattern due to blockage by an adjacent pattern.

Hereinafter, a pattern measuring method, a pattern measuring tool, and a computer-readable medium will be described with an object of appropriately measuring a height and a depth of a pattern having a high aspect ratio.

Solution to Problem

A pattern measuring method, a pattern measuring tool, and a computer-readable medium will be described as a mode for achieving the above object. The method includes: receiving a signal obtained by irradiating a wafer with a beam using the pattern measuring tool; measuring a width between a first pattern and another pattern formed on the wafer and identifying a value corresponding to a signal amount between the first pattern and the other pattern, based on reception of the signal; and calculating height information from a portion between the first pattern and the other pattern to an upper portion of a pattern based on the measured width between the first pattern and the other pattern and the value corresponding to the signal amount between the first pattern and the other pattern.

Advantageous Effect

According to the above configuration, it is possible to appropriately measure a height and a depth of a pattern having a high aspect ratio.

BRIEF DESCRIPTION OF DRAWINGS

FIG. 1 is a flowchart showing a pattern height measuring process.

FIG. 2 shows an example of a scanning electron microscope (beam irradiation subsystem).

FIGS. 5A to 5D show an example of an image obtained when a pattern with a known height is irradiated with a beam.

FIG. 6 shows an example of an image obtained when a pyramid sample is irradiated with a beam.

FIG. 7 shows how the azimuth angle ϕ of the signal electron changes according to the pattern height.

FIG. 8 is a flowchart showing a forming process of a database in which a relationship between a device condition and the elevation angle θ is stored.

FIG. 9 is a flowchart showing a process of acquiring a reference signal to obtain a value regarding the azimuth angle ϕ.

FIG. 10 shows an example of a GUI picture to set pattern height measurement conditions.

FIG. 11 is a block diagram showing an embodiment of a non-transitory computer-readable medium in which program instructions executable on a computer system of a pattern measuring tool are stored.

FIG. 12 illustrates an example of a detector having a plurality of divided detection surfaces.

FIG. 13 shows signal intensity distribution detected by the divided detection surfaces.

FIG. 14 is another flowchart showing a pattern height measuring process.

FIG. 15 illustrates an example of a movable diaphragm disposed between a sample and a detection surface.

FIG. 16 is a graph showing a relationship between an opening angle of the movable diaphragm and a signal amount.

FIG. 17 shows an example of a scanning electron microscope including a movable diaphragm mechanism.

FIG. 18 is a flowchart showing a pattern height measuring process.

DESCRIPTION OF EMBODIMENTS

Figure 3A:
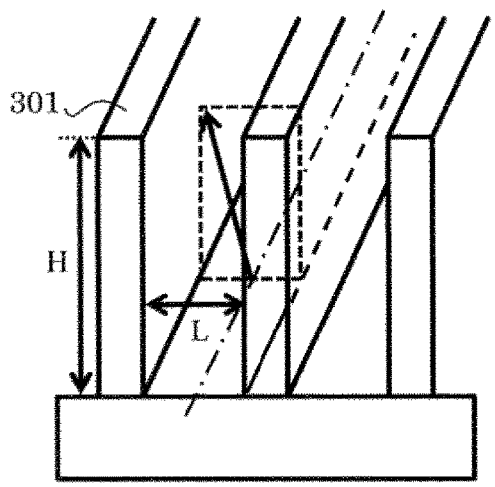
FIGS. 3A to 3D show a trajectory of a signal electron when a groove pattern is irradiated with a beam.
Figure 3B:
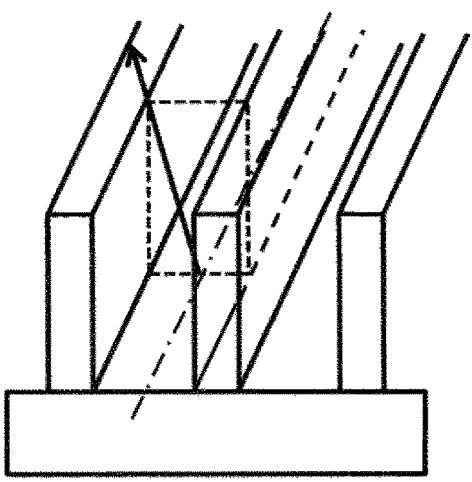
Figure 3C:
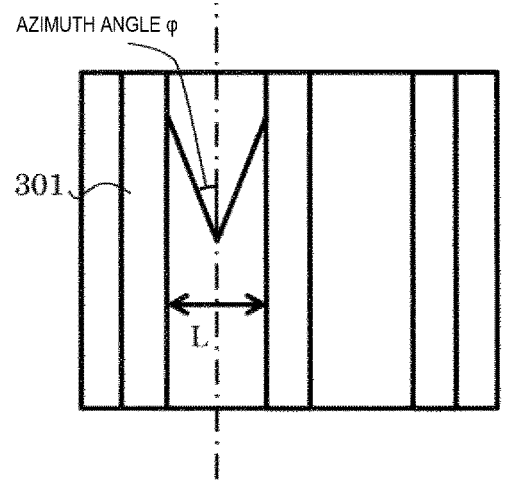
Figure 3D:
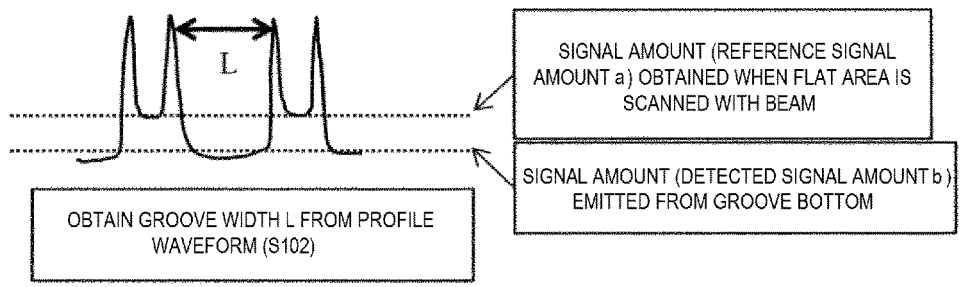

In recent years, in order to integrate semiconductor devices, a technique of forming a fine pattern on a wafer surface using multi-patterning or EUV exposure is applied in the manufacturing process. A Critical-Dimension Scanning Electron Microscope (CD-SEM) that is a charged particle beam application device, is used to inspect and measure the shape of a fine pattern of several tens nm or less in-line.

Meanwhile, dimension measurement in a height direction of the pattern has become important with the process becoming complicated. In order to realize the dimension measurement in the height direction using a CD-SEM or the like, it is conceivable to visualize information about the height direction, for example, by irradiating the pattern with a beam such that primary electrons of the beam are incident on the pattern inclinedly. Regarding the height (depth) of the pattern, however, in case of a pattern that is adjacent to a high aspect ratio groove and has a relatively narrow interval with an adjacent pattern, it is difficult for the inclined beam to reach the bottom of the groove, and it is difficult to obtain information necessary for height measurement.

Embodiments described below will describe a method and a device to geometrically calculate a height of a three-dimensional pattern based on signals whose amount changes mainly in accordance with a height of the pattern, and a non-transitory computer-readable medium that stores program instructions that cause a computer to perform the method. For example, for signals (for example, secondary electrons) from the bottom of a groove pattern, an azimuth angle of electrons that can escape from the groove changes according to the depth of the groove. In other words, an azimuth angle of escapable signals is limited as the groove becomes deeper (the azimuth angle becomes narrower). Since an amount of electrons (signal amount) emitted from a sample does not vary according to a direction of the azimuth angle, there is a specific correlation between the depth of the groove and the signal amount. Therefore, evaluation of the signal amount can be used to measure the height of the pattern (the depth of the groove formed between patterns).

According to a method of evaluating the pattern height based on identification of the signal amount, it is possible to appropriately measure the pattern height, even when the interval between patterns is narrow and evaluation by image processing is difficult.

The present embodiment relates to a pattern measuring tool. The pattern measuring tool includes a beam irradiation subsystem that detects a signal obtained by irradiating a sample with a beam and generates an output in response to the detection. For example, the pattern measuring tool includes a beam irradiation subsystem (scanning electron microscope 120) as shown in FIG. 2. Electrons emitted from an electron source 101 are accelerated by an accelerating electrode (not shown), and a sample 106 (for example, a wafer on which a pattern is formed) is irradiated with the electrons as a primary electron beam 102 (electron beam). The electron beam is reduced by focusing lenses 103 and 104, and is focused by an objective lens 105 to form a micro spot on the sample 106.

The primary electron beam 102 scans an observation area (field of view) on the sample by a deflector 107. As a result, signal electrons 108 such as secondary electrons (SE) and backscattered electrons (BSE) from the sample 106 are emitted. The signal electrons 108 are detected by colliding against a detection plate 110 to generate an SEM image. A scintillator, for example, is disposed on a detection surface of the detection plate 110. Light generated by the scintillator is guided by a light guide or the like, converted into electrons again through a photomultiplier tube, and is amplified and converted into an electrical signal. The electrical signal is sent to a display device or a frame memory (not shown), and is displayed or stored. Since scanning of the display device and scanning of the deflector 107 are synchronized, a change in brightness corresponding to the amount of signal electrons is shown on the display device to display an SEM image.

A detector that draws and detects secondary electrons converted by a conversion electrode may be adopted in place of a detector that directly detects signal electrons emitted from a sample. The conversion electrode generates secondary electrons by the collision of the signal electrons, and is disposed on a trajectory of the signal electrons.

Components of the scanning electron microscope 120 are controlled by a control system 201. The control system 201 controls the components of the scanning electron microscope in accordance with program instructions 1102 stored in a computer-readable medium 1101 shown in FIG. 11.

The scanning electron microscope 120 is also coupled to a computer system 202 (computer subsystem) via one or more transmission media, and an output of the detection plate 110 is transmitted to the computer system 202 via the transmission media as a suitable output signal such as an electrical signal, signal data, or image data. The output signal is processed in accordance with at least one of program instructions 1102 and a processing instruction that is input from an input and output device 1104. The processed data is stored in a memory 1103 and is displayed on a display device (not shown) of the input and output device 1104.

The computer system may have various forms such as a personal computer system, an image computer, a mainframe computer system, a workstation, a network device, an internet device, or another device.

The control system 201 and the computer system 202 execute the program instructions 1102 so as to measure the pattern in accordance with steps to be described below.

FIG. 1 is a flowchart showing a process of measuring a height of a pattern (a depth from an upper surface to a bottom of the pattern) based on detection of signal electrons. The control system 201 controls a sample stage 111 and the like so that a pattern position that is a measurement target of the sample 106 introduced into the scanning electron microscope 120 matches with a position of field of view for the scanning electron microscope 120, and acquires an SEM image (step 101). In order to adjust the position of field of view, a beam irradiation position may be adjusted using a deflector to move field of view (not shown). The computer system 202 measures a width L of a groove as shown in FIG. 3(*d*) by generating a profile waveform based on the output signal of the detection plate 110 (step 102). FIG. 3(*a*) shows an example of a sample having a deep groove formed between line patterns, FIG. 3(*b*) shows an example of a sample having a shallow groove, and FIG. 3(*c*) shows an example of an electron microscope image of a groove pattern shown in FIGS. 3(*a*) and 3(*b*).

The computer system 202 performs measurement by extracting intensity distribution (line profile) of the secondary electrons along a line orthogonal to an edge of a measurement target pattern (at least two line patterns 301 in FIG. 3(*a*)). It should be noted that, if only one line profile is extracted, the measurement may be affected by local fluctuations in edges of the pattern. Therefore, the intensity distribution of the secondary electrons along a plurality of lines may be obtained and these values may be averaged to obtain a line profile when a higher accuracy is required. The groove width L is calculated based on the line profile. Peak positions of the line profile are identified by a threshold method or the like, and dimensions between peaks are measured, so that the groove width is measured.

Next, the computer system 202 calculates a signal amount b of the groove bottom and a signal amount a of the pattern upper surface (sample upper surface) (step 103). As shown in FIG. 3(*d*), the signal amount at a position of the profile waveform corresponding to the groove bottom and the signal amount at a position corresponding to the pattern upper surface are obtained. The signal amount is normalized by comparing a state, in which signal electrons can be detected without colliding against an obstacle such as a pattern, with another state, in which signal electrons collide against a pattern sidewall since the signal electrons are emitted from the groove bottom, leading to a decrease of the detected amount.

As shown in FIGS. 3(*a*) and 3(*b*), even if the electrons (arrow 301) are emitted in the same direction, the electrons can escape to outside when the height of the pattern is small (FIG. 3(*b*)), but the electrons collide against the pattern sidewall and cannot escape to the outside when the height of the pattern is large (FIG. 3(*a*)).

More specifically, as shown in FIG. 7, when irradiating each groove portion of samples having pattern heights $H_1$, $H_2$, and $H_3$ ($H_3 > H_2 > H_1$) respectively, it can be seen that an azimuth angle of signal electrons that can escape to the outside from the groove bottom, which indicates spread of a specific elevation angle in the signal electron emission direction, changes according to the pattern height. As shown in FIG. 7, it can be seen that the azimuth angle is narrower as the pattern height becomes higher (when $H_3 > H_2 > H_1$, $\phi_1 > \phi_2 > \phi_3$).

In this example, the pattern height is estimated based on the identification of the signal amount since the amount of electrons (signal amount) that can be detected changes according to the pattern height. In this example, in order to further normalize the signal amount, a signal amount (signal amount when $\phi = 90°$) when in a state in which the signal amount is not limited by the pattern is obtained, and information about the azimuth angle $\phi$ is calculated based on comparison between the signal amount a and the signal amount b (step 104). Specifically, a signal amount obtained when the upper surface of the pattern is irradiated with a beam is set as a reference signal amount a, a signal amount obtained when the bottom of a deep groove is irradiated with a beam is set as a measurement signal amount b, and information about the azimuth angle $\phi$ is obtained based on calculation of the measurement signal amount b/the reference signal amount a.

In this example, the solution of b/a is defined as $\phi$ since the azimuth angle $\phi$ becomes narrower and the signal amount decreases as the height of the pattern is increased. However, the invention is not limited thereto, and a value indicating the azimuth angle $\phi$ or a degree to which the signal amount changes according to the azimuth angle may be calculated based on a function of parameters regarding b and $\phi$ including other variation factors. The signal amount b becomes smaller as the depth of the groove is increased and the signal amount b becomes larger as the width of the groove becomes larger. Therefore, the value regarding the height of the pattern is calculated based on the identification of the value (value corresponding to the signal amount, for example, b/a) that changes according to the signal amount of the groove and based on the measurement of the dimension value of the groove width in this example. The present embodiment describes an example in which an actual dimension value is calculated as the height information, but the invention is not limited thereto. For example, a value indicating a relative degree of height such as a height 1, a height 2 and a height 3 may be output as the height information. In this case, the height information may also be obtained by preparing a table, in which a value obtained by an operation expression to be described below and a value indicating a degree of height are stored in association with each other, and referring to the table with the value obtained by the operation expression.

Further, as described above, the pattern height can be grasped to some degree even when only L/b is solved because both the signal amount b and the groove width L are parameters that change in accordance with the pattern height. For example, when L/b is obtained for two grooves under an assumption that the device conditions of the scanning electron microscope are the same, it can be seen that the depths of the two grooves differ if the obtained values are different. Further, it can be seen that the groove having the larger value is shallower and the other groove having the smaller value is deeper. In this manner, the difference in the depth (height) of a plurality of patterns, or the deeper (shallower) one of the plurality of patterns, may be output as the height information.

In order to identify a selective signal amount (not including an edge portion or a pattern upper portion) of a groove portion, a Region of Interest (ROI) may be selectively set in the groove portion, or a signal amount corresponding to the groove may be identified from a signal profile.

$\phi$ is a parameter indicating a degree to which a signal can escape from the groove. FIG. 3 shows an example in which the reference signal amount a is obtained by irradiating the upper portion of the pattern with a beam. The reference signal amount a may also be obtained in advance at another place, stored in the memory 1103 or the like, and read at the time of pattern height measurement. FIG. 9 is a flowchart showing a process of obtaining the reference signal amount a. First, a wafer is introduced into the scanning electron microscope 120 (step 901), and the field of view is moved to a flat portion (reference data acquisition portion) on the sample (step 902). In order to enable proper normalization at the time of pattern height measurement, it is desirable to ensure the material of the groove bottom where height measurement is performed to be identical with the material of the reference data acquisition portion. Further, it is desirable to ensure the optical conditions to be identical at the time of beam irradiation.

Next, an image is generated based on beam scanning, and a signal amount of the reference data acquisition portion is evaluated (steps 903 and 904). After the evaluation value (luminance value) is registered in the memory 1103 or the like as the reference signal amount, the sample is taken out from the scanning electron microscope 120 (steps 905 and 906). Accordingly, the reference data (reference signal amount) can be obtained in advance and used for calculation at the time of height measurement.

In the height measuring process shown in FIG. 1, an elevation angle $\theta$ (a parameter regarding the elevation angle $\theta$) corresponding to an optical condition of the scanning electron microscope stored in advance in the memory 1103 or the like is read after step 104 (step 105). The groove L may be measured or a parameter regarding $\phi$ may be calculated, after the parameter regarding the elevation angle is read.

The measurement target pattern may be in any shape, as long as the amount of signal electrons escaping out of the pattern changes according to the elevation angle and the detected signal amount changes.

The elevation angle $\theta$ is calculated in advance by simulation or by irradiating a pattern having a known shape with a beam, and is registered in the memory 1103 or the like.

When obtaining the elevation angle by simulation, the simulation is performed with measurement conditions being used as parameters, and the measurement conditions include at least one of a) the device conditions such as configurations (the position and the size of the detector, the arrangement conditions of other optical elements, and the like) of the electron microscope and the optical conditions (arrival energy (accelerating voltage) of electron beam toward the sample, beam current, and the like), and b) the material and the shape of the measurement target pattern and the like. Therefore, trajectories of electrons emitted from the sample are calculated, and the elevation angle θ of the signal electrons detected by the detector disposed in the electron microscope is calculated. The elevation angle θ changes according to the shape and the position of the detector.

When obtaining the elevation angle by irradiating a pattern having a known shape with a beam, the following method is adopted, for example. In this example, the elevation angle θ is calculated by measuring a length of a shadow appearing on an obtained SEM image. FIG. 5 shows a method of obtaining the elevation angle θ under a device condition set by irradiating a pattern having a known height (depth) with a beam. When an area including an edge of a pattern having a height of $h_1$ is scanned with the beam as shown in FIG. 5(a), an SEM image as shown in FIG. 5(b) can be obtained. When looking at the SEM image, it can be seen that a shadow portion darker than the rest portion is contained therein. This is because signal electrons emitted from an area in a distance range of less than 1 (=$h_1$/tan θ) from a sidewall 503 (edge) of a pattern 502, collide against the sidewall 503 and cannot escape to the outside of the groove, with the elevation angle being θ.

Therefore, the elevation angle θ of the signal electrons is obtained by using this phenomenon under a certain device condition. Specifically, the elevation angle θ is obtained by measuring the shadow length l using a profile 504 and by solving $\tan^{-1}$ (l/h). The same applies to a groove pattern as shown in FIG. 5(c). The shadow length l is measured and the elevation angle θ is calculated after the SEM image shown in FIG. 5(d) is obtained.

Further, the elevation angle θ can be measured using a sample in a recessed pyramid shape as shown in FIG. 6. Such a sample can be formed, for example, by performing crystal anisotropic etching on a silicon substrate, and an accurate known inclination angle ($θ_s$) can be formed. Accordingly, the sample can be used to measure the elevation angle θ with high accuracy. When obtaining the elevation angle θ using the pyramid-shaped sample, it is possible to measure the shadow length l (length of the shadow (low luminance portion) with an edge of the pyramid as a start point) and the depth d (depth of an end portion of the shadow) based on an SEM image obtained by scanning the sample with a beam, and solve $\tan^{-1}$ (d/l). For example, d can be obtained by solving $l_2 \times \tan θ_s$.

FIG. 8 is a flowchart showing a process of generating a database of the elevation angle θ. First, device conditions of the electron microscope are set, a sample such as a pyramid sample that has known dimensions and a known inclination angle is scanned with a beam to generate an SEM image, and a length of a shadow, for example, is measured (steps 801 and 802). Next, by performing the calculation as described above, information (a value indicating a magnitude of an elevation angle or a value indicating a magnitude of an angle, represented in degrees, radians, or the like) about the elevation angle θ is calculated (step 803). The information about the elevation angle is calculated under a plurality of device conditions, and a database indicating a relationship between the device conditions and the elevation angle is constructed (step 804). By storing the constructed database in a predetermined storage medium (step 805), collection of information about the elevation angle is finished.

As the pattern used in obtaining the elevation angle θ, patterns in other shapes may be used as long as the relationship among a known shadow length, the pattern shape and the elevation angle is geometrically obtained.

By constructing the database in advance, the elevation angle θ can be read at the time of pattern height measurement, so that the pattern height H can be obtained based on the elevation angle θ, the azimuth angle φ and the groove width L (step 107).

A pyramid sample as shown in FIG. 6 may be placed as a standard sample on a sample stage of the scanning electron microscope 120, and information about the elevation angle θ may be obtained by irradiating the pyramid sample with a beam under the same optical conditions as those under which a pattern whose height is to be measured is irradiated, at the time of actual pattern height measurement. According to such a method, it is possible to obtain information necessary for height measurement without constructing a database or the like in advance.

Figure 4A:
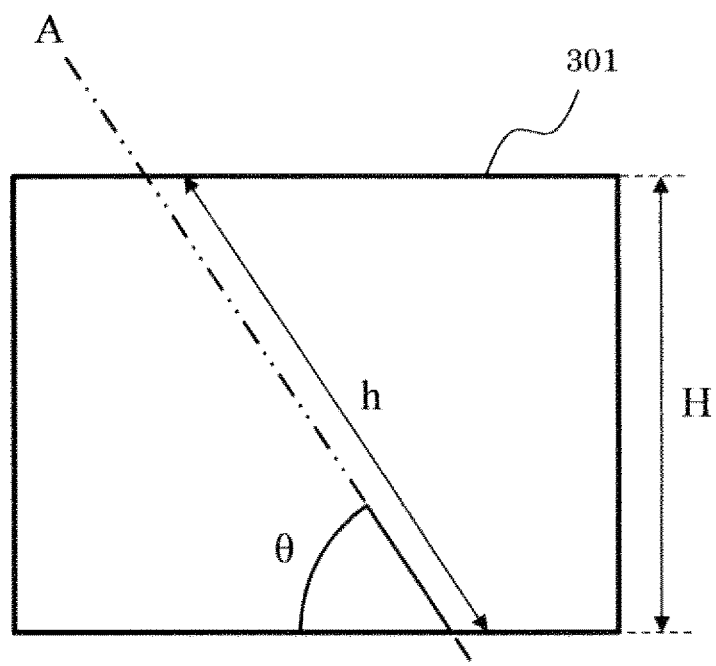
FIGS. 4A and 4B show a relationship between an azimuth angle ϕ and an elevation angle θ of the signal electron.
Figure 4B:
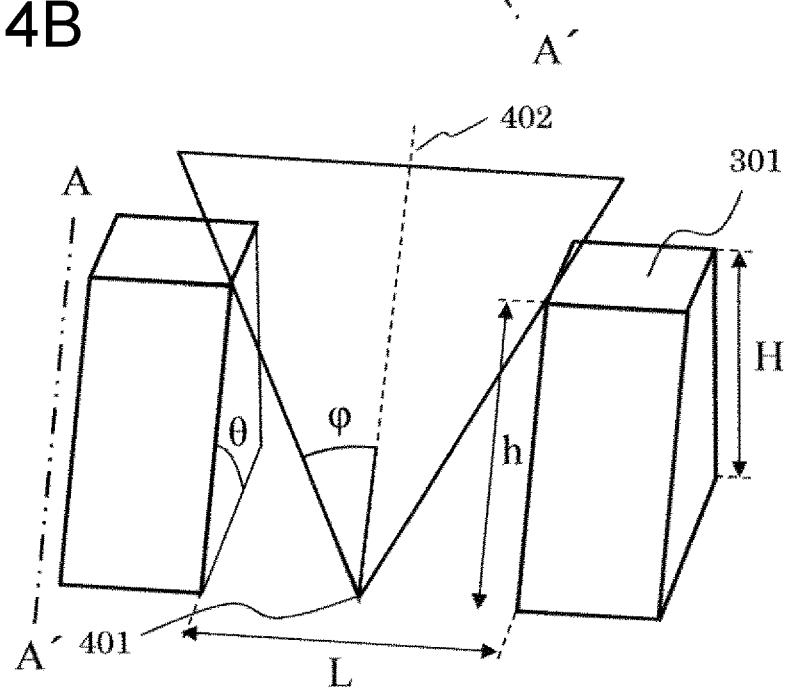

The reason why the pattern height is obtained by obtaining a value regarding the elevation angle θ that changes according to optical conditions or the like and by measuring a value regarding the groove width L and the azimuth angle φ will be described with reference to FIG. 4. FIG. 4(a) shows a side view of the line pattern 301, and FIG. 4(b) shows a cross-sectional view of the pattern when cut in a direction (direction A-A' in FIG. 4(a)) parallel to the elevation angle θ. First, a relational expression between the pattern height H and the elevation angle θ is defined as Expression 1.

$$h = H/\sin θ \quad \text{[Expression 1]}$$

h represents a distance from a beam irradiation point 401 to a point where the electrons escape to the outside of the groove along a reference line 402 of the azimuth angle φ.

Next, a relational expression between h and the azimuth angle φ is defined as Expression 2.

$$\tan φ = L/2h \quad \text{[Expression 2]}$$

L is the groove width obtained by the profile acquisition. Expression 2 is substituted in Expression 1 to produce an operation expression for solving the pattern height H which is Expression 3.

$$H = L \cdot \sin θ / 2 \tan φ \quad \text{[Expression 3]}$$

Expression 3 is a relational expression consisting of the groove width L, the azimuth angle φ, the elevation angle θ and the pattern height H. Such a relational expression and correlation information of parameters in the table are stored in advance in a predetermined storage medium, and are received through a computer system including a processor capable of performing operation processing so that the pattern height measurement can be performed.

The pattern height H calculated as described above is output as height information to a display device or the like provided in the input and output device 1103 or the like (step 107).

According to the method and computer system that perform the above-described processing, it is possible to measure the pattern height even when the interval between adjacent patterns is narrow, the incidence of the inclined beam is difficult, or sufficient information is not obtained in the simple image processing.

Energy of secondary electrons emitted from the sample varies depending on the optical conditions to be used, and the elevation angle also changes in accordance with the variation in the energy of the secondary electrons. Therefore, a simulation is performed in the device configuration to be used, with the secondary electron energy, the elevation angle θ, and the azimuth angle ϕ as parameters. The relationship between the optical conditions and the elevation angle θ used in the device is stored in a database. When height measurement is performed, a dimension value L of a recessed portion such as a groove and the azimuth angle ϕ are measured, and a height H is calculated by citing an elevation angle θ from the database.

Next, another example of obtaining the azimuth angle ϕ will be described. FIG. 12 illustrates an example of a detection surface 110 having a plurality of divided detection surfaces 1201. FIG. 12 illustrates the shape of the detection surface 110 when the detection surface 110 is viewed from the sample side. These divided detection surfaces 1201 are axisymmetrical with respect to an electron beam passage opening 1202 (ideal optical axis of the electron beam), and are provided for angular discrimination and detection of electrons scattered in a plurality of directions. FIG. 13 shows output (signal intensity) of each divided detection surface 1201. As described above, the azimuth angle in the emitting direction of the electrons emitted from a hole bottom or a groove bottom is limited in accordance with the pattern height (depth). Therefore, if a range of the divided detection surface 1201 that outputs a signal of a predetermined value or more can be identified, the azimuth angle can be identified.

FIG. 13 shows an example of signal intensity distribution obtained when a space defined by line patterns as shown in FIG. 7 is irradiated with an electron beam. In the case of the space defined by the line patterns, many electrons are emitted in a direction parallel to an edge of the line patterns. In the example of FIG. 13, peaks of signal intensity appear on a divided detection surface in a direction angled 90° and a direction opposite thereto angled 180°. For example, if a detection surface indicating a signal intensity equal to or more than a predetermined threshold is identified, the azimuth angle of the emitted electrons having escaped out of the groove can be obtained without being blocked by the pattern.

FIG. 14 is a flowchart showing a process of measuring the pattern height by using a scanning electron microscope provided with a detector that includes the divided detection surface 1201. An SEM image is generated based on electrons detected by the divided detection surface 1201, and the groove width L is calculated using the SEM image (steps 1401 and 1402). When forming a waveform profile for measuring the groove width, a profile may be generated by combining signals obtained by a plurality of divided detection surfaces so as to improve S/N, or a profile may be generated based on signals detected by another detector that is provided.

Next, the computer system 202 identifies a divided detection surface that outputs a signal amount equal to or more than a preset threshold, and identifies an azimuth angle ϕ (steps 1403 and 1404). In this case, azimuth angle information may be stored in association with each divided detection surface in advance, and an addition value of the azimuth angle of the divided detection surface that outputs the signal amount equal to or more than the threshold may be identified as the azimuth angle of the emitted electrons. Instead of performing threshold determination, the azimuth angle may be calculated by referring to a table, in which azimuth angle information and distribution information of signal intensity is stored in association, with the distribution information of signal intensity output by the divided detection surface for each azimuth.

The subsequent processing is the same as that in the flowchart of FIG. 1, and the pattern height H is calculated and output based on the provided information. The azimuth angle is identified by providing a plurality of fan-shaped divided detection surfaces in the example of FIG. 12. However, the invention is not limited thereto, and the azimuth angle may be identified by arranging detection surfaces in matrix in the position of the detection surface 110, providing light emitting elements such as scintillators on the detection surfaces and disposing a plurality of light guides to guide optical signals obtained by the respective scintillators. It is also possible to use other detection elements such as a semiconductor detector.

Next, an example of obtaining the azimuth angle of the electrons emitted from the groove bottom by arranging a movable diaphragm between the sample and the detection surface 110 will be described. The movable diaphragm restricts the azimuth angle of the electrons reaching the detection surface 110.

FIG. 15 illustrates an example of a movable diaphragm 1500 having an electron beam passage opening 1501. The movable diaphragm 1500 in FIG. 15 is disposed between the detection surface 110 and the sample 106, and limits the azimuth angle of the emitted electrons reaching the detection surface. The movable diaphragm 1500 includes four diaphragm blades 1503 to 1506 that rotate about a beam optical shaft 1502. The four diaphragm blades are disposed at different heights in the optical shaft direction, and are disposed such that the diaphragm blades can overlap with each other when viewed from the electron source 101. Each of the diaphragm blades presents a fan shape when viewed from the electron source 101 side, and is rotatably supported by a cylindrical body forming the electron beam passage opening 1501. Each of the diaphragm blades rotates about the beam optical shaft 1502 by a rotation mechanism (not shown), and the rotation mechanism is controlled according to an instruction of the control system 201 so as to have an arbitrary opening angle $\phi_4$ at an arbitrary position.

FIG. 17 shows an outline of a scanning electron microscope that includes a second detector 1702, a deflector 1701 that deflects signal electrons toward the second detector 1702, and the movable diaphragm 1500 in FIG. 15. Other configurations are the same as those in FIG. 1.

FIG. 18 is a flowchart showing a process of calculating the azimuth angle of the emitted electrons using the scanning electron microscope shown in FIG. 17 and of measuring the pattern height based on the calculated azimuth angle. First, a field of view is positioned at a place where a measurement target is located, using the stage 1702 or a deflector that moves the field of view (not shown) (step 1801). Next, beam scanning is performed with the opening angle of the movable diaphragm set to $\phi_1$, the signal intensity of the groove portion of the groove pattern is detected based on detection signals of the detection surface 110, and an image for measuring the groove width L, or a luminance profile is generated based on an output of the second detector 1702 (steps 1802 and 1803).

At this time, if the output signal (signal intensity) of the detection surface 110 does not satisfy a predetermined condition, the processing returns to step 1801, and conditions of movement of the field of view and the movable diaphragm are changed repeatedly until the predetermined condition is satisfied. The azimuth angle ϕ is identified through such a process. As shown in FIG. 16, the signal amount detected by the detection surface 110 is larger as the opening angle of the diaphragm becomes larger. However, the signal intensity does not increase any more when the opening angle of the movable diaphragm widens to or larger than the azimuth angle $\phi$. Accordingly, an opening angle $\phi_n$ of the diaphragm at which the increase of the signal intensity stops can be defined as the azimuth angle $\phi$. In the computer system 202, the opening angle $\phi$ is automatically determined along the flowchart of FIG. 18.

In the present embodiment, for a plurality of design data, line-and-space patterns in which the same line patterns are arranged are taken as targets. When moving the field of view, accumulation of charge due to irradiating the pattern with the beam continuously to a specific portion is reduced by positioning the field of view in patterns generated under substantially the same condition. But if it is not necessary to consider the influence of charge, the azimuth angle $\phi$ that satisfies predetermined criteria may be identified by repeating steps 1802 and 1803.

Meanwhile, in conjunction with the determination of the azimuth angle $\phi$, an image or a signal profile is generated based on the output of the detector 2, and the groove width L is measured (step 1804). When steps 1801 to 1803 are repeated, since the signals are detected by the detector 2 for a plurality of times, the S/N may be improved by adding up and averaging the signals, and the measurement accuracy of the groove width L maybe improved.

Next, the elevation angle $\theta$ is read from a storage medium or the like (step 1805). The elevation angle $\theta$, the azimuth angle $\phi$, and the groove width L are substituted into Expression 3 to calculate the height H and output the height information (steps 1806 and 1807).

When the movable diaphragm 1500 is placed between the sample 106 and the detection surface 110, the detection efficiency of the signal electrons is reduced. Therefore, when the height measurement is not performed, a drive mechanism that retracts it from between the sample 106 and the detection surface 110 may be provided for example, in a device including only one detector.

FIG. 10 shows an example of a Graphical User Interface (GUI) picture in which height measurement conditions are set. Such a GUI picture is displayed on a display device provided in the input and output device 1103 or the like, and a measurement condition can be input via an input device such as a pointing device or a keyboard. An operation program (recipe) to operate the scanning electron microscope is created and stored in a predetermined storage medium by the computer system 202, based on information set via the GUI picture.

A recipe setting screen 1001 includes an input window 1002 to input identification information of a pattern (target) that is a height measurement target, an SEM condition setting window 1003 to mainly set optical conditions of a scanning electron microscope, and a measurement condition setting window 1004 to set measurement conditions used to measure a dimension of a pattern based on obtained signal electrons.

The input window 1002 is provided with input frames to input names and coordinates (X-Y coordinates) of a measurement target pattern and display frames 1005 that indicate registration status of elevation angle (EA) information. In the example of FIG. 10, the elevation angle information is not registered. The computer system 202 determines whether or not elevation angle information corresponding to the optical conditions (accelerating voltage, landing energy, and the like) set in the SEM condition setting window 1003 is registered, with reference to an index of the database registered in the memory 1103 or the like. For example, "N/A" is displayed when not registered, and "reg" is displayed when registered.

The SEM condition setting window 1003 is provided with input frames to input, for example, magnitude of field of view (FOV), an accelerating voltage (Vacc), a beam current (Iprobe), and the number of frames to be used for image generation (accumulated number). The computer system 202 sets a control program that mainly controls the sample stage of the electron microscope and the optical elements of the electron microscope based on information input from the SEM condition setting window 1003.

The measurement condition setting window 1004 is provided with input frames to input, for example, measurement methods, pattern orientation, measurement algorithm, and the number of edges appearing in a picture. Based on information input to these input frames, signal processing conditions and calculation processing conditions are set in the computer system 202. The measurement condition setting window 1004 is provided with a selection frame 1006 to select how to acquire a value that is not obtained in measuring a pattern that is a height measurement target. The value is a parameter used for height measurement calculation such as the elevation angle $\theta$.

In the selection frame 1006 shown in FIG. 10, Automatic Data Acquisition (ADA) is selected. When such a setting is made, the computer system 202 operates a sample stage before or after a wafer, on which a pattern that is a height measurement target is formed, is introduced into the scanning electron microscope, so that a standard sample (for example, the pyramid sample shown in FIG. 6) placed on the sample stage is positioned at an irradiation position of a beam. The computer system 202 then sets the operation program to execute steps 801 to 803 in FIG. 8. The elevation angle information obtained by the measurement is stored in the memory 1103 or the like as shown in FIG. 1 for height measurement processing.

REFERENCE SIGN LIST 101 electron source
102 primary electron beam
103 focusing lens
104 focusing lens
105 objective lens
106 sample
107 deflector
110 detection plate
120 scanning electron microscope
201 control system
202 computer system

The invention claimed is:

1. A pattern measuring method, comprising:
receiving a signal obtained by irradiating a wafer with a beam using a pattern measuring tool;
measuring a width between a first pattern and another pattern formed on the wafer and identifying a value corresponding to a signal amount between the first pattern and the other pattern, based on reception of the signal; and
calculating height information from a portion between the first pattern and the other pattern to an upper portion of the pattern based on the measured width between the first pattern and the other pattern and the value corresponding to the signal amount between the first pattern and the other pattern, wherein the height information is calculated based on
H =L·sinθ/2tan φ
H: the height information
L: the width between the first pattern and the other pattern
θ: a value that changes according to a shape and a position of a detector
φ: the value corresponding to the signal amount between the first pattern and the other pattern.

2. The pattern measuring method according to claim 1, wherein
the signal amount emitted from between the first pattern and the other pattern is measured based on the reception of the signal, and the height information is calculated based on a comparison between the measured signal amount and a reference signal amount.

3. The pattern measuring method according to claim 2, wherein
a value φ corresponding to the signal amount between the first pattern and the other pattern is calculated based on
φ=b/a
a: the reference signal amount emitted from the upper portion of the pattern
b: the measured signal amount.

4. A pattern measuring tool that includes a beam irradiation subsystem, which irradiates a wafer with a beam and thus generates an output in response to a signal from the wafer, and a computer subsystem, wherein
the computer subsystem:
receives the signal obtained by irradiating the wafer with the beam using the pattern measuring tool;
measures a width between a first pattern and another pattern formed on the wafer and identifies a value corresponding to a signal amount between the first pattern and the other pattern, based on reception of the signal; and
calculates height information from a portion between the first pattern and the other pattern to an upper portion of the pattern based on the measured width between the first pattern and the other pattern and the value corresponding to the signal amount between the first pattern and the other pattern,
wherein the computer system calculates the height information based on
H =L·sinθ/2tanφ
H: the height information
L: the width between the first pattern and the other pattern
θ: a value that changes according to a shape and a position of a detector
φ: the value corresponding to the signal amount between the first pattern and the other pattern.

5. The pattern measuring tool according to claim 4, wherein
the computer system measures the signal amount emitted from between the first pattern and the other pattern based on the reception of the signal, and calculates the height information based on a comparison between the measured signal amount and a reference signal amount.

6. The pattern measuring tool according to claim 5, wherein
the computer system calculates a value φ corresponding to the signal amount between the first pattern and the other pattern based on
φ=b/a
a: the reference signal amount emitted from the upper portion of the pattern
b: the measured signal amount.

7. The pattern measuring tool according to claim 4, comprising: a storage medium that stores the θ, wherein the storage medium stores the θ corresponding to a device condition of the beam irradiation subsystem.

8. The pattern measuring tool according to claim 4, comprising: a storage medium that stores the θ, wherein the computer system measures a length of a shadow that starts from an edge of a pattern having a known height based on the signal obtained by irradiating the pattern having a known height with the beam.

9. The pattern measuring tool according to claim 8, wherein the computer system calculates the θ based on
θ=tan-1(l/h)
l: the length of the shadow
h: the known height of the pattern.

10. The pattern measuring tool according to claim 4, comprising: a storage medium that stores the θ, wherein the computer system measures a length of a shadow that starts from an edge of a pattern having a known inclination angle based on the signal obtained by irradiating the pattern having a known inclination angle with the beam.

11. The pattern measuring tool according to claim 10, wherein the computer system calculates an elevation angle θ based on
θ=tan-1(d/l)
d: a depth of an end portion of the shadow of the pattern having a known inclination angle
l: the length of the shadow.

12. The pattern measuring tool according to claim 10, wherein
the pattern having a known inclination angle is in a pyramid shape.

13. The pattern measuring tool according to claim 4, wherein
the beam irradiation subsystem includes a stage to place the wafer, and a pattern having a known height or a known inclination angle is formed on the stage.

14. A non-transitory computer-readable medium that stores program instructions executable on a computer system of a pattern measuring tool so as to perform a method that is implemented by a computer that measures a pattern formed on a wafer, wherein
the method that is implemented by the computer includes:
receiving a signal obtained by irradiating the wafer with a beam using the pattern measuring tool;
measuring a width between a first pattern and another pattern formed on the wafer and identifying a value corresponding to a signal amount between the first pattern and the other pattern, based on reception of the signal; and
calculating height information from a portion between the first pattern and the other pattern to an upper portion of the pattern based on the measured width between the first pattern and the other pattern and the value corresponding to the signal amount between the first pattern and the other pattern,
wherein the height information is calculated based on
H =L·sinθ/2tanφ
H: the height information
L: the width between the first pattern and the other pattern
θ: a value that changes according to a shape and a position of a detector
φ: the value corresponding to the signal amount between the first pattern and the other pattern.

15. The non-transitory computer-readable medium that stores program instructions according to claim 14, wherein the signal amount emitted from between the first pattern and the other pattern is measured based on the reception of the signal, and the height information is calculated based on a comparison between the measured signal amount and a reference signal amount.

16. The non-transitory computer-readable medium that stores program instructions according to claim 15, wherein a value $\phi$ corresponding to the signal amount between the first pattern and the other pattern is calculated based on $\phi = b/a$ a: the reference signal amount emitted from the upper portion of the pattern b: the measured signal amount.

\* \* \* \* \*